United States Patent
Norsworthy et al.

(10) Patent No.: US 7,561,635 B2
(45) Date of Patent: Jul. 14, 2009

(54) VARIABLE CODER APPARATUS FOR RESONANT POWER CONVERSION AND METHOD

(75) Inventors: Steven R. Norsworthy, Cardiff, CA (US); Jason Rupert Redgrave, Mountain View, CA (US)

(73) Assignee: STMicroelectronics NV (NL)

( * ) Notice: Subject to any disclaimer, the term of this patent is extended or adjusted under 35 U.S.C. 154(b) by 25 days.

(21) Appl. No.: 10/910,941

(22) Filed: Aug. 3, 2004
(Under 37 CFR 1.47)

(65) Prior Publication Data
US 2005/0163232 A1      Jul. 28, 2005

Related U.S. Application Data

(60) Provisional application No. 60/493,053, filed on Aug. 5, 2003.

(51) Int. Cl.
*H04L 27/04* (2006.01)
*H04B 14/06* (2006.01)

(52) U.S. Cl. .................... 375/295; 375/247; 341/143

(58) Field of Classification Search ............... 375/297, 375/295, 247; 341/143, 155, 131, 139, 156, 341/144, 141; 330/149, 2, 136
See application file for complete search history.

(56) References Cited

U.S. PATENT DOCUMENTS

| | | | | |
|---|---|---|---|---|
| 5,079,550 A | * | 1/1992 | Sooch et al. | 341/143 |
| 5,144,308 A | * | 9/1992 | Norsworthy | 341/131 |
| 5,243,345 A | * | 9/1993 | Naus et al. | 341/143 |
| 5,274,375 A | * | 12/1993 | Thompson | 341/143 |
| 5,298,900 A | * | 3/1994 | Mauthe et al. | 341/143 |
| 5,450,028 A | * | 9/1995 | Therssen | 327/91 |
| 5,598,158 A | * | 1/1997 | Linz | 341/143 |
| 5,745,061 A | * | 4/1998 | Norsworthy et al. | 341/131 |
| 5,760,722 A | * | 6/1998 | Harris et al. | 341/143 |
| 5,892,397 A | * | 4/1999 | Belcher et al. | 330/149 |
| 5,905,453 A | | 5/1999 | Kase | |

(Continued)

FOREIGN PATENT DOCUMENTS

| | | |
|---|---|---|
| EP | 0 756 384 A3 | 1/1997 |
| WO | WO 01/10035 A1 | 2/2001 |

OTHER PUBLICATIONS

A comparison of modulator networks for high-order oversampled $\Sigma\Delta$ analog-to-digital converters Ribner, D.B.;Circuits and Systems, IEEE Transactions on vol. 38, Issue 2, Feb. 1991 pp. 145-159.*

(Continued)

*Primary Examiner*—Temesghen Ghebretinsae
(74) *Attorney, Agent, or Firm*—Lisa K. Jorgenson; William A. Munck

(57) ABSTRACT

A noise-shaping coder with variable or reconfigurable characteristics is disclosed. In one exemplary embodiment, an improved apparatus for signal modulation is disclosed. The apparatus generally comprises a noise-shaping coder having programmable coefficients, programmable coder order, programmable oversampling frequency, and/or programmable dither. In a second exemplary embodiment, an improved method for implementing noise shaping coding is disclosed. The apparatus generally comprises a means for switching from one order coder to another order coder, as well as switching oversampling frequency.

28 Claims, 9 Drawing Sheets

U.S. PATENT DOCUMENTS

| | | | |
|---|---|---|---|
| 6,028,544 A * | 2/2000 | Zarubinsky et al. | 341/143 |
| 6,075,411 A * | 6/2000 | Briffa et al. | 330/149 |
| 6,175,321 B1 * | 1/2001 | Frannhagen et al. | 341/143 |
| 6,373,418 B1 * | 4/2002 | Abbey | 341/143 |
| 6,445,318 B1 * | 9/2002 | Ruha et al. | 341/131 |
| 6,480,129 B1 * | 11/2002 | Melanson | 341/143 |
| 6,518,904 B1 * | 2/2003 | Jelonnek | 341/143 |
| 6,577,192 B2 * | 6/2003 | Maniwa et al. | 330/149 |
| 6,577,258 B2 * | 6/2003 | Ruha et al. | 341/143 |
| 6,593,828 B1 * | 7/2003 | Helfenstein et al. | 333/17.1 |
| 6,727,832 B1 * | 4/2004 | Melanson | 341/143 |
| 6,920,182 B2 * | 7/2005 | Bolton, Jr. | 375/247 |
| 7,116,721 B1 * | 10/2006 | Melanson et al. | 375/247 |
| 2002/0171485 A1 * | 11/2002 | Cova | 330/149 |
| 2004/0036636 A1 * | 2/2004 | Mai et al. | 341/131 |
| 2004/0036640 A1 * | 2/2004 | Kawamura | 341/143 |
| 2004/0037363 A1 * | 2/2004 | Norsworthy et al. | 375/259 |
| 2005/0041756 A1 * | 2/2005 | Rosen | 375/295 |
| 2005/0088328 A1 * | 4/2005 | Kawamura | 341/143 |
| 2005/0116849 A1 * | 6/2005 | Melanson et al. | 341/143 |

OTHER PUBLICATIONS

A 3.3 V two-stage fourth-order sigma-delta modulator with gain compensation technique Chiang Jen-Shiun; Chou Pao-Chu; Circuits and Systems, 1998. IEEE APCCAS 1998. The 1998 IEEE Asia-Pacific Conference on; Nov. 24-27, 1998 pp. 1-4.*

Variable-structure delta-sigma modulators with resolution enhancement strategies Zourntos, T.; Johns, D.A.; Circuits and Systems, 1999. 42nd Midwest Symposium on vol. 1, Aug. 8-11, 1999 pp. 460-463 vol. 1.*

Variable-structure compensation of delta-sigma modulators: stability and performance Zourntos, T.; Johns, D.A.;Circuits and Systems I: Fundamental Theory and Applications, IEEE Transactions on vol. 49, Issue 1, Jan. 2002 pp. 41-53.*

J. Keyzer et al "Digital Generatin of RF signal for wireless communcations with bandpass Delta sigma modualtion" IEEE 2001.*

Davis, W. Alan et al., Radio Frequency Circuit Design Series: Wiley Series in Microwave and Optical Engineering, Published online Oct. 9, 2001, Chapter 9, Section 9.3. 9.4.

Peng, Kang-Chun et al., "A Novel EER Transmitter Using Two-Point Delta-Sigma Modulation Scheme for WLAN and 3G Applications", Microwave Symposium Digest, 2002 IEEE MTT-S International, vol. 3, Jun. 2-7, 2002, pp. 1651-1654.

Ata, O.W. "Predistortion as an Effective Technique for Linearisation of Basestation Amplifiers in a Mobile Radio Cellular System" Personal Wireless Communications, 1997 IEEE International Conference on Dec. 17-19, 1997, pp. 147-151.

Xiaopeng Li et al., "A Single-Chip CMOS Front-End Receiver Architecture For Multi-Standard Wireless Applications," 2001 IEEE, pp. IV-374-IV-377.

* cited by examiner

VARIABLE CODER APPARATUS FOR RESONANT POWER CONVERSION AND METHOD

PRIORITY

This application claims priority to U.S. Provisional Application Ser. No. 60/493,053 of the same title filed Aug. 5, 2003, incorporated herein by reference in its entirety.

RELATED APPLICATIONS

This application is related to co-owned and co-pending U.S. patent application Ser. No. 10/382,297 filed Mar. 4, 2003 and entitled "RESONANT POWER CONVERTER FOR RADIO FREQUENCY TRANSMISSION AND METHOD", published on Feb. 26, 2004 as U.S. Patent Publication No. 20040037363, which claims priority benefit of U.S. provisional patent application Ser. No. 60/361,812 of the same title filed Mar. 4, 2002, and co-owned and co-pending U.S. patent application Ser. No. 10/382,326 filed Mar. 4, 2003 and entitled "CODER APPARATUS FOR RESONANT POWER CONVERSION AND METHOD" published on Nov. 20, 2003 as U.S. Patent Publication No. 20030216906, which claims priority benefit of U.S. provisional patent application Ser. No. 60/361,813 of the same title filed Mar. 4, 2002, each of which are incorporated by reference herein in their entirety. This application is also related to co-owned U.S. patent application Ser. No. 10/910,910 entitled "NOISE SHAPED INTERPOLATOR AND DECIMATOR APPARATUS AND METHOD" (which claims priority to U.S. provisional patent application Ser. No. 60/493,041 filed Aug. 5, 2003), and U.S. patent application Ser. No. 10/910,917 entitled "RADIO FREQUENCY DIGITAL-TO-ANALOG CONVERTER" (which claims priority to U.S. provisional patent application Ser. No. 60/493,052 filed Aug. 5, 2003), both filed contemporaneously herewith and incorporated by reference herein in their entirety-.

COPYRIGHT

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

1. FIELD OF THE INVENTION

The present invention relates generally to signal processing, and specifically in one exemplary aspect to efficient apparatus and methods for signal modulation and noise-shaping encoding. While this present invention is not limited to any particular field of application, the present invention may be applied, for example, to radio frequency communications, and specifically to apparatus and methods for radio frequency (RF) signal transmission, reception, and/or modulation.

2. DESCRIPTION OF RELATED TECHNOLOGY

Delta-sigma modulators (also generally known as noise-shaping coders) are well known in the prior art. Relevant discussion on the subject of delta-sigma modulators and data conversion may be found in, e.g., the textbook by Norsworthy, et al. entitled *Delta-Sigma Data Converters*, IEEE Press, 1997, incorporated herein by reference in its entirety.

Many years ago, data converters based on delta-sigma modulation became feasible for commercial implementation. First-order single-bit delta-sigma modulators (coders) are desirable due to their inherent simplicity and economy of implementation. However, the industry has largely avoided first-order coders in favor of second- and higher-order coders because first-order single-bit coders inherently produce idle channel tones and correlated noise at intolerably high levels with respect to the required noise floor. Also, first-order coders require significantly higher oversampling ratios to achieve the same in-band resolution as higher-order coders. The quantization noise spectrum produced by delta-sigma modulation increases by approximately 3+6.02N dB per octave, where N is the order. For a given baseband width, this implies that lower-order coders require a higher oversampling ratio, hence, a higher-speed clock and higher-speed circuit components, resulting possibly in higher power consumption (and cost) than desired. In addition, modern VLSI technologies have virtually eliminated any cost penalty in additional complexity of implementation for higher-order coders.

However, high-order coders have several potential disadvantages. First, they have loop instability, with corresponding limitations on dynamic range that accompany instability. The higher the loop gain, the more limited the dynamic range of the coder before the onset of instability.

Another disadvantage of higher-order coders is the steepness of the slope of rising quantization noise out-of-band that must be filtered. If the application is a D/A converter, this filter is analog. Using the aforementioned formula 3+6.02N dB per octave, first-order coders produce about 9 dB/octave rise in quantization noise; second-order coders rise at 15 dB/octave; third-order coders at 21 dB/octave; etc. When noise-shaping coders are used for D/A conversion, this out-of-band quantization noise is reduced by an analog post-filter. In order to reduce this noise to an acceptable system level, the order of the analog filter is typically one higher than the order of the coder. For example, if the coder is third order, then the filter is fourth order. One motivation of using delta-sigma modulation is to make the signal processing more digital and less analog. Therefore, if the analog filter is too complex, the benefit obtained from the use of the delta-sigma modulator is somewhat diminished.

Digital radio communications standards, including without limitation CDMA, WCDMA, UMTS, GSM, GPRS, EDGE, IEEE 802.11a/b/g, and UWB, have relatively wide dynamic range. At higher power levels, the signal-to-noise ratio and spectral emission requirements may be different than at lower power levels. If a noise-shaping coder is used in implementing a function which affects these requirements, then having additional degrees of freedom in changing the noise-shaping characteristics at various power levels would be beneficial and highly desirable. Prior art solutions do not provide the desired level of performance, and/or do not provide the aforementioned degrees of freedom in varying the noise-shaping profile of the modulator based on particular applications (and power levels within those applications), especially "dynamically" such as during operation.

SUMMARY OF THE INVENTION

The present invention satisfies the aforementioned needs by providing an improved apparatus and methods for signal modulation.

In a first aspect of the invention, an improved apparatus for signal modulation is disclosed. The apparatus generally comprises a dynamically adjustable coding apparatus for use in an RF communications or data system. In one embodiment, the coder comprises a noise-shaping deltas-sigma coder having programmable coefficients, programmable coder order, programmable oversampling frequency, and/or programmable dither. In one variant, a single variable coder is utilized, wherein the order of the coder can be changed dynamically. In another variant, the variable coder comprises three separate coders that are selectively switched or multiplexed to an output. The ability to vary one or more of the foregoing parameters allows the coder to be tailored dynamically to its operating environment, including significantly reducing power consumption during certain periods of operation.

In a second aspect of the invention, a power-efficient RF transmitter is disclosed. In one embodiment, the transmitter comprises: a baseband processor; an antenna, and a noise-shaping coder apparatus operatively disposed in the signal path between said processor and said antenna. The coder apparatus is adapted to selectively alter its configuration during operation in order to reduce power consumption by the transmitter. The coder apparatus comprises a delta-sigma modulator, and said alteration of configuration comprises selectively varying at least one of (i) coder order; (ii) clock generation or oversampling, and (iii) dither level, for said modulator.

In a third aspect of the invention, an improved method of operating a modulator in an RF system is disclosed, the method generally comprising: providing a delta-sigma modulator having a plurality of orders associated therewith; and selectively operating said delta-sigma modulator at different ones of said plurality of orders based on at least one parameter. In one embodiment, the plurality of orders comprise at least third- and fifth-orders, and the parameter is related to transmission power. The order of said modulator is varied as a function of the required transmission power; higher power causes the modulator to operate at a higher order in order to increase the out-of-band noise suppression relative to the transmitted signal.

In a fourth aspect of the invention, an improved noise shaping coder adapted for use in an RF system is disclosed. In one embodiment, the coder comprises a delta-sigma modulator adapted to dispose at least one noise shaping artifact substantially at one or more frequency bands of interest. The modulator can operate as a fifth-order coder, and disposes a double-pair of complex zeros within the receive band for the RF system. The receive band artifact can be readily adapted for wideband standards such as CDMA2000, WCDMA or the like, thereby avoiding interference due to quantization noise.

In a fifth aspect of the invention, an improved method for implementing noise shaping coding is disclosed. The method generally comprises switching the order of one or more coders and/or oversampling frequencies as a function of operational parameters in order to achieve a desired performance objective. In one embodiment, the order and/or oversampling are varied as a function of transmitter power and signal level in order to allow the coder to operate at the lowest possible power consumption while still meeting or exceeding all noise level performance requirements. In one variant, the control signals to the modulator(s) are turned on prior to the coder order selection to mitigate transient effects on the coders.

In a sixth aspect of the invention, an improved RF communications device is disclosed, generally comprising the improved programmable noise-shaping encoder described above. In one exemplary embodiment, the device comprises a high-speed integrated circuit disposed within a mobile device such as a CDMA cellular handset. The integrated circuit may be stand-alone, or integrated with any number of other components (such as a direct-conversion resonator) in order to provide an SoC type solution and minimize form factor.

BRIEF DESCRIPTION OF THE DRAWINGS

The features, objectives, and advantages of the invention will become more apparent from the detailed description set forth below when taken in conjunction with the drawings, wherein.

DETAILED DESCRIPTION OF THE INVENTION

Figure 1:
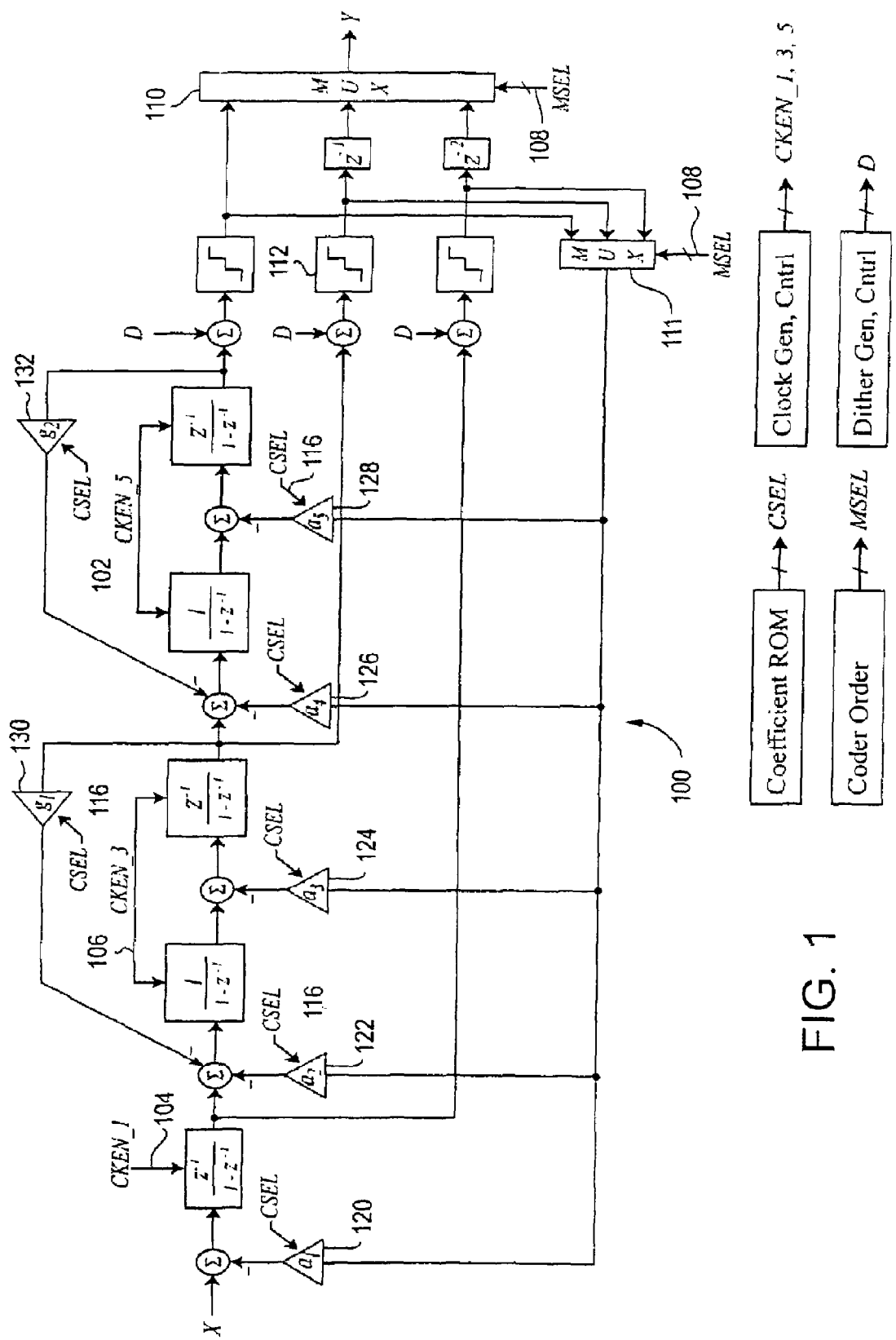
FIG. 1 is a functional block diagram illustrating an exemplary embodiment of a noise-shaping coder having programmable coefficients, programmable coder order, programmable oversampling frequency, and programmable dither.

Reference is now made to the drawings wherein like numerals refer to like parts throughout.

As used herein, the terms "transmit", "transmission" and "transmitting" for convenience may generally be considered to refer to either the act of transmitting signals or receiving signals, as applicable.

As used herein, the term "wireless" refers to any radio frequency interface used to transmit data or other information including, without limitation, those utilizing direct sequence spread spectrum (DSSS) (e.g., code division multiple access or CDMA), frequency hopping spread spectrum (FHSS), frequency division multiple access (FDMA), time division multiple access (TDMA), or orthogonal frequency division multiplexing (OFDM), or any variations, combinations, or embodiments thereof, such as for example, WCDMA, CDMA-2000, 3GPP, 3GPP2, PCS, IEEE-Std. 802.11x, or GSM.

As used herein, the term "code division multiple access," or CDMA, generally refers to digital wireless technology that uses a spread spectrum technique to disperse a signal across a wide range of frequencies, such as according to a pseudo-noise or other code. As used herein, the term "processor" is meant generally to include all types of data or signal processing devices including, without limitation, digital signal processors (DSPs), reduced instruction set computers (RISC), general-purpose (CISC) processors, microprocessors, gate arrays (e.g., FPGAs), Reconfigurable Compute Fabrics (RCFs), and application-specific integrated circuits (ASICs). Such digital processors may be contained on a single unitary IC die, or distributed across multiple components.

As used herein, the term "integrated circuit (IC)" refers to any type of device having any level of integration (including without limitation ULSI, VLSI, and LSI) and irrespective of process or base materials (including, without limitation Si, SiGe, CMOS and GAs). ICs may include, for example, memory devices (e.g., DRAM, SRAM, DDRAM, EEPROM/Flash, ROM), digital processors, SoC devices, FPGAs, ASICs, ADCs, DACs, transceivers, and other devices, as well as any combinations thereof.

As used herein the terms "memory" and "storage device" are meant to include any means useful in storing data or information, including, without limitation, RAM (e.g., SRAM, SDRAM, DRAM, SDRAM, EDR-DRAM, DDR), ROM (e.g., PROM, EPROM, EEPROM, UV-EPROM), magnetic bubble memory, optical memory, embedded flash memory, etc.

Overview—

As previously discussed, digital communications standards have relatively wide dynamic range. At higher power levels, the signal-to-noise ratio and spectral emission requirements may be different than at lower power levels. Hence, a noise-shaping coder is needed that provides additional degrees of freedom in changing the noise-shaping characteristics at various power levels. Ideally, such noise shaping coder would minimize the use of complex analog circuitry, and also operate so as to require a minimum of power.

The coder apparatus of the present invention addresses these issues by generally altering the noise-shaping characteristics by one or more variables, including but not limited to combinations of the coder order, the oversampling ratio, and the location of coder poles or zeros. The analog post-filter is optionally changed during system operation by dynamically moving the pole or zero locations. Advantageously, this dynamic adjustment may effectively change the insertion loss of the filter as well. Changing one or more of the aforementioned parameters dynamically during system operation permits a new range of opportunities to optimize overall system performance including reducing power consumption.

Hence, the present invention provides in effect a new class of noise-shaping coders that allow dynamic alteration of coder characteristics as a function of changing of system dynamics.

Exemplary Embodiments—

It will be recognized that while the following discussion is cast primarily in terms of a wireless RF handset (e.g., cellular telephone), the present invention is in no way limited to any particular wireless method, air interface, or architecture, or for that matter wireless applications. The invention may be applied with equal success to non-wireless (e.g., wireline) systems of any kind as well, consistent with any limitations described herein.

The aforementioned co-pending U.S. patent application Ser. No. 10/382,297 entitled "RESONANT POWER CONVERTER FOR RADIO FREQUENCY TRANSMISSION AND METHOD" discloses one approach for placing a noise-shaping zero at the adjacent receive frequency offset from the transmitter. An example is provided therein for a third-order coder, which allows a single zero at DC and a complex pair of zeros at ±80 MHz. This noise-shaping zero at 80 MHz, along with the attenuation of the resonator's response 80 MHz above the transmitter frequency, combine to provide sufficient rejection down to the thermal noise floor, so that the receiver is not substantially degraded by the transmitter's quantization noise.

This method, while useful, may be improved by inter alia placing a double pair of complex zeros and poles at or near the frequencies used. This results in a fifth order coder and greatly relaxes the requirements on the resonator's rejection above the transmitter frequency. Furthermore, it allows the fifth-order coder to have modest loop gain and good stability while still providing even more quantization noise suppression at the offset frequency (e.g. 80 MHz). Note that the double pair of zeros do not have to be identical, but simply closely spaced, such that the notch is wider than before. This property is advantageous in systems utilizing wider channels. For example, under Wideband CDMA (WCDMA) and UMTS (Universal Mobile Telephone System) requirements, the channel is 3.84 MHz wide rather than 1.25 MHz wide as under traditional CDMA. The 'valley' of quantization noise that must be carved out at the receive frequency under the wideband standards is therefore roughly three times wider than for CDMA standards described in IS-98 and IS-2000.

Figure 2:
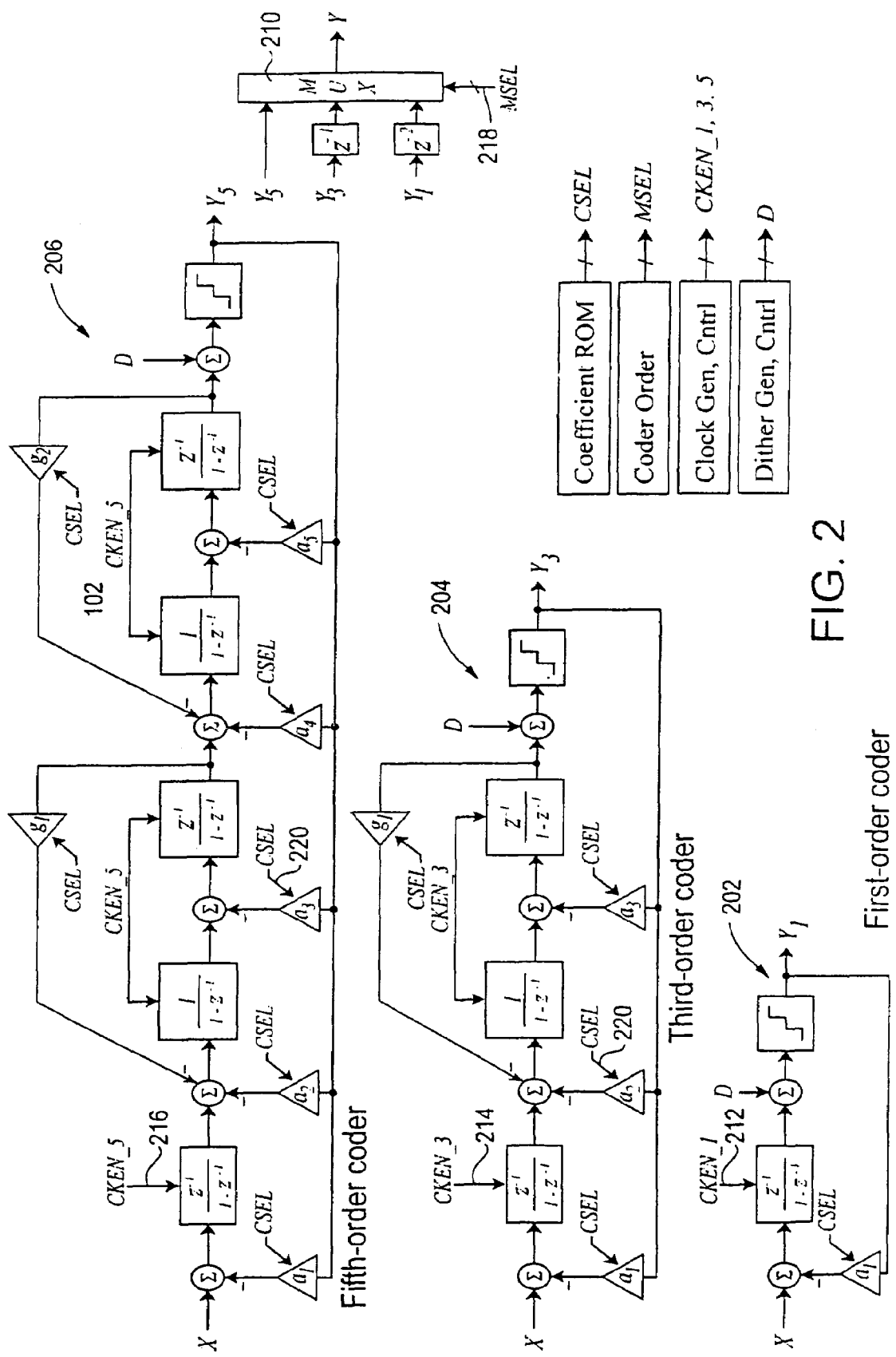
FIG. 2 is a functional block diagram illustrating an exemplary configuration of three noise-shaping coders multiplexed together, and adapted for switching from one order coder to another order coder, as well as switching oversampling frequencies.

FIGS. 1 and 2 show two exemplary embodiments of the invention described herein. FIG. 1 generally illustrates a variable coder apparatus 100 having (i) programmable coefficients, (ii) programmable coder order (e.g. first-, third-, and fifth-order in the illustrated embodiment), (iii) programmable clock frequency and clock control, and (iv) programmable dither.

Optionally, to save power, only the needed coder registers associated with the apparatus 100 may be clocked, leaving unused coder registers unclocked. For example, if the coder order desired is third-order, then control signal CKEN_5 102 may be turned off, while control signals CKEN_1 104 and CKEN_3 106 remain on. As switching from one coder order or configuration to another is desired, these control signals may be turned on prior to the coder order selection MSEL control signal to mitigate the transient effect of the coders (and likewise turned off after selection is completed if desired).

MSEL 108 is a control signal for selecting which quantizer feedback signal to use, as well as which output on the multiplexer 110 to use. For example, if the coder order desired is third-order, then the middle quantizer 112 in FIG. 1 would be routed through the multiplexers 110, 111. CSEL 116 is in the illustrated embodiment a bus used for writing the coder coefficient values (described in greater detail subsequently herein) of a1 120, a2 122, a3 124, a4 126, a5 128, g1 130, and g2 132, such that the coder can be configured as desired, as a function of the changing dynamics of the system (and/or other parameters), as previously described.

Advantageously, dither generation may also be dynamically controlled in the apparatus 100 of FIG. 1. For example, each coder configuration may need a different level of dither for optimum operation. In one variant, the coder order is used as the sole determinant of the dither level (such as via accessing a lookup table correlating dither level and coder order). Alternatively, the dither level D may be a function of multiple variables such as, inter alia, the coder order and the input signal level, X, of the coder:

$$D = f(y, z \dots) \qquad \text{Eqn. 1}$$

Where:
D=dither level
y=first dither variable (e.g., coder order)
z=second dither variable (e.g., input signal level)

As above, this two-variable dither level function can be pre-stored in a table or other such structure, or alternatively determined "on the fly" such as via an algorithm. Note that the dither determination can also be made dynamic, such as based on one or more "feedback" or control variables or objectives of interest. For example, enforcing a low-power or conservation mode for the coder device 100 as a whole (or even the broader parent transmitter or communications device as a whole) may restrict the allowed dither levels to a predetermined range or set of possible values. Alternatively, the error rate or some other metric(s) of channel quality may be monitored and the dither level adjusted according to a scheme (such as small but progressively increasing perturbations in alternating increasing or decreasing direction of dither level), such that apparatus 100 in effect "tunes" itself to an optimal dither level for the selected coder order and other operating conditions.

Myriad other dither level control schemes readily implemented by those of ordinary skill may also be utilized consistent with the invention.

FIG. 2 illustrates another exemplary embodiment of the apparatus 200, wherein the variable coder is treated as three separate coders (first-202, third-204, and fifth-order 206) that are selectively multiplexed together via an output multiplexer 210. In this embodiment, the coefficients of the respective individual coders are programmable, as are the clock frequency, clock control, and dither generation. Control signals CKEN_1 212, CKEN_3 214, and CKEN_5 216, MSEL 218, and CSEL 220 function in a manner similar to those described for the embodiment shown in FIG. 1.

While FIGS. 1 and 2 show substantially integrated and discrete multi-order coder apparatus, respectively, it will be appreciated that various other arrangements and configurations are possible consistent with the present invention. For example, in another embodiment, the noise-shaped coder apparatus comprises coders of only two orders (e.g., only third- and fifth-order coders). This "two-coder" apparatus may be configured generally as shown in FIG. 1 or 2, provided that only two coders are present versus three.

As yet another variant, the architectures of FIGS. 1 and 2 may be hybridized, such as where the third- and fifth-order coders are made substantially integral (as in FIG. 1), with the first-order coder being substantially separate therefrom. The outputs of the two circuits (i.e., third-/fifth-order coder and first-order coder) can then be muxed or switched as shown generally in FIG. 2. This approach is particularly advantageous where the expected duty cycle or percentage of use of one coder is different from that of the others. For example, by separating a very low duty cycle coder out from the others, operational or structural features desired or advantageous for the high-duty cycle coders need not be applied to the low-duty coder, or vice versa. This can offer further advantages in terms of power consumption; e.g., such as where the registers and other components associated with the low-duty cycle coder remain unclocked until that coder is needed. This more simplistic binary or "on or off" clocking approach obviates some of the intelligence required to selectively switch portions of the coder apparatus were the three coders integrated.

As still another variant, architectures employing switching between the coders of FIGS. 1 and 2 (or combinations thereof) can be used. For example, it may be determined that the apparatus 100 of FIG. 1 is useful under a certain set of conditions, while that of FIG. 2200 is optimal under another set of conditions. Hence, an intelligent switching "algorithm" (here, preferably embodied as switching hardware logic for high speed response) can be utilized to trade off between the two apparatus 100, 200 during operation. The non-used coder can also optionally be put to sleep by selectively switching off its clocks, reducing their frequency, etc. as described elsewhere herein, thereby reducing power consumption when not in use.

Figure 3:
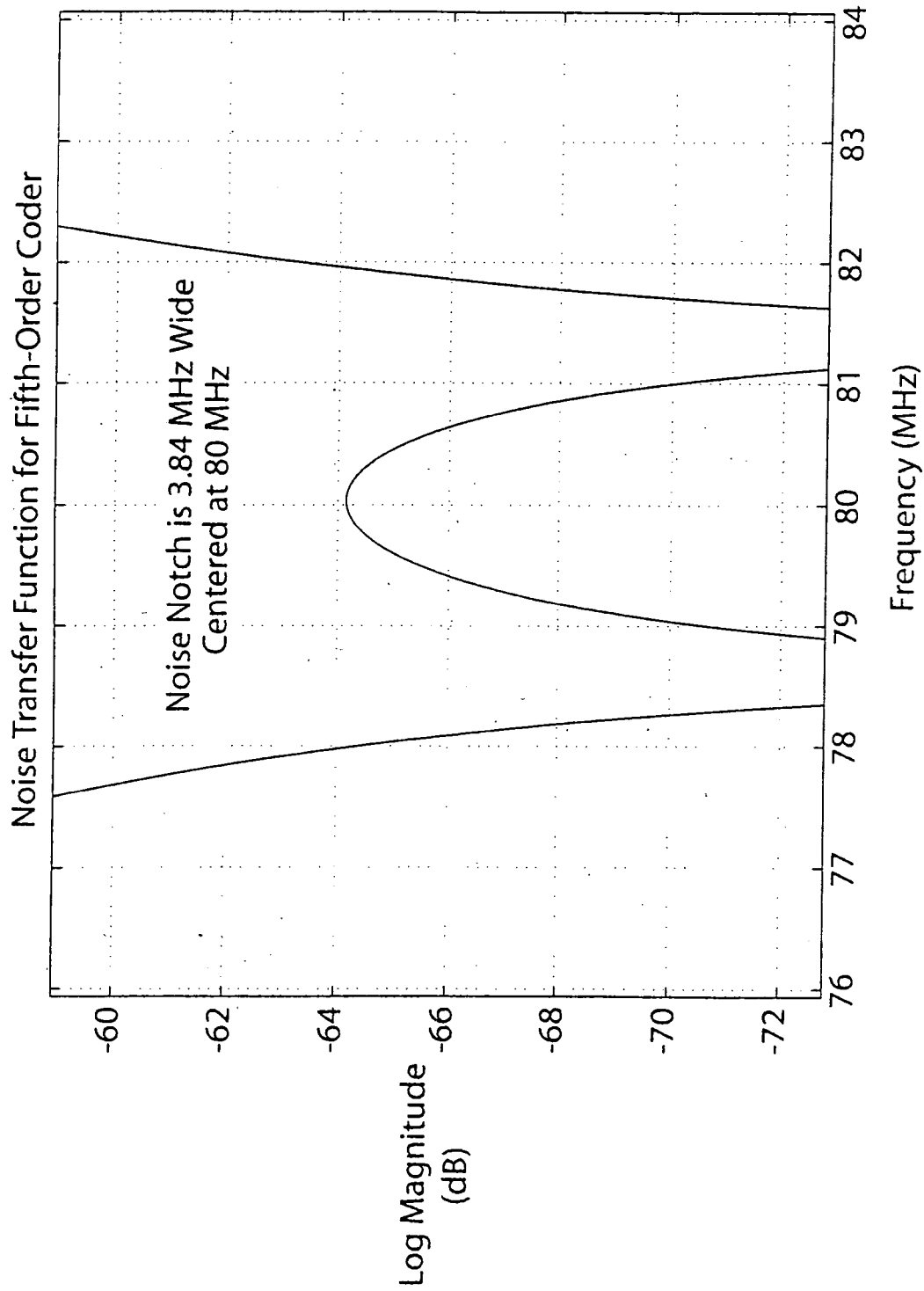
FIG. 3 is a graph of the noise transfer function (partial) of an exemplary fifth-order noise-shaping coder having a pair of complex zeros and poles spaced such that 3.84 MHz of bandwidth is removed out of the quantization noise of the coder at the receive frequency.

FIG. 3 is a partial graph of the noise transfer function of a fifth-order noise-shaping coder having a pair of complex zeros and poles spaced such that 3.84 MHz of bandwidth is advantageously carved out of the quantization noise of the coder at the receive frequency.

Figure 4:
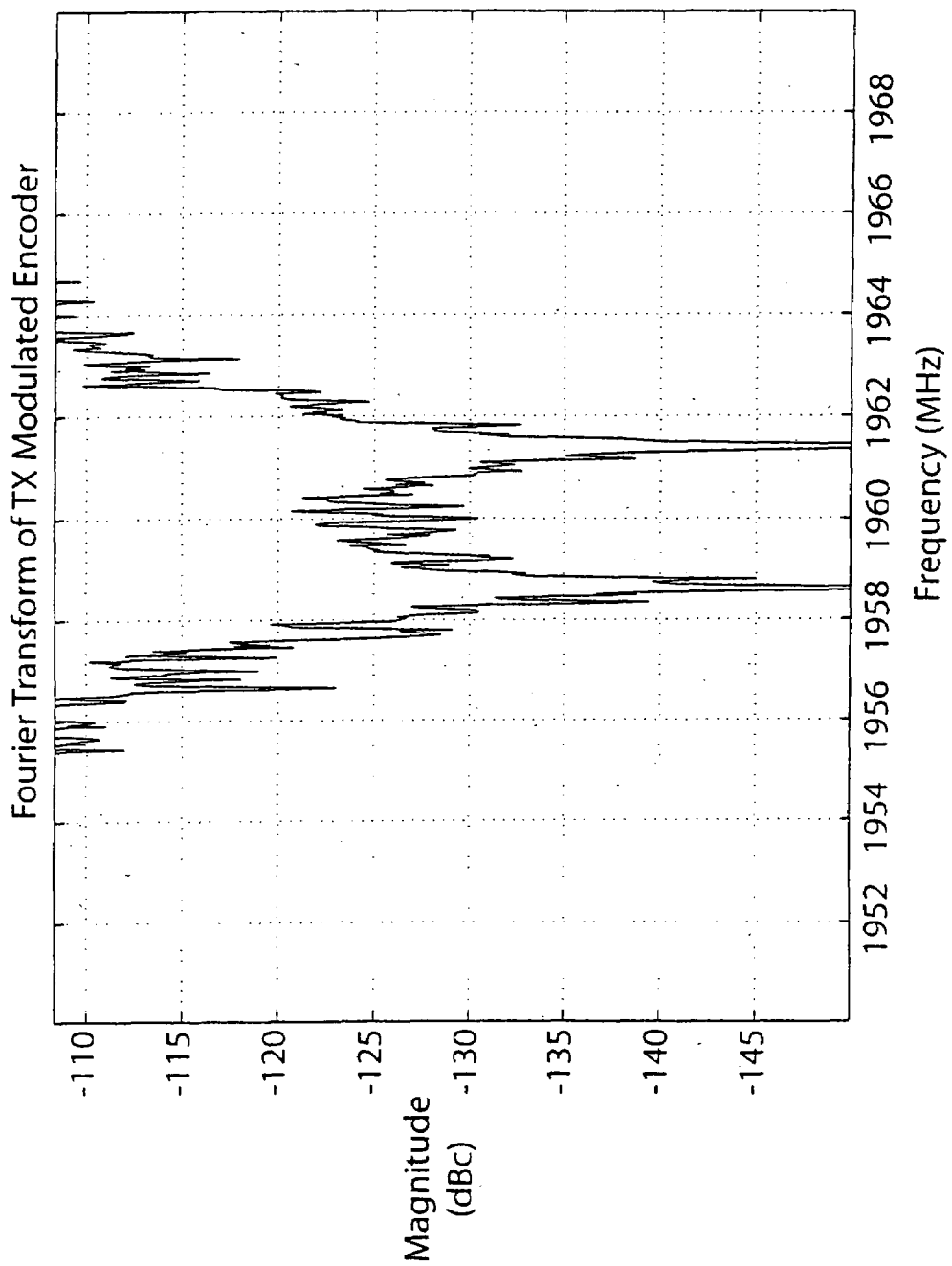
FIG. 4 is graph of the spectrum (partial) of the transmitted modulated waveform prior to the analog resonator bandpass filter for the implementation of FIG. 3.

FIG. 4 is a partial graph of the spectrum of the transmitted modulated waveform prior to the analog resonator bandpass filter for the coder associated with the transfer function of FIG. 3.

Figure 5:
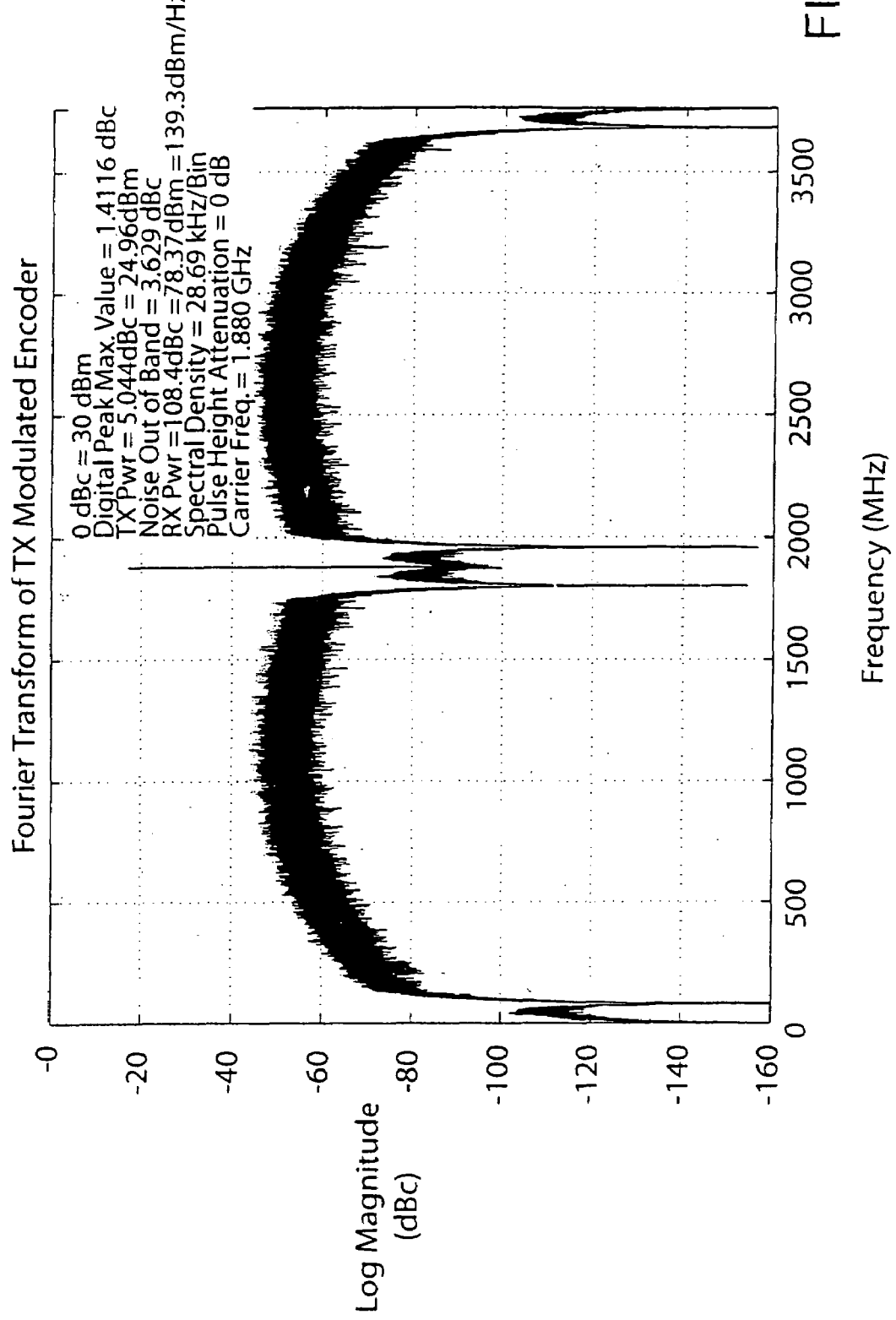
FIG. 5 is an expanded view of the exemplary spectrum of FIG. 4.

FIG. 5 is a graph of a wider range of the spectrum of FIG. 4. Note that in FIG. 5, the noise at the receive frequency is −139 dBm/Hz. An additional 40 dB of suppression is readily achievable by utilizing an analog resonator bandpass filter of the type well known in the signal processing arts.

Automatic Gain Control—

Modern communications systems (e.g. CDMA, WCDMA, and UMTS) often employ automatic gain control (AGC). The CDMA system described by the IS-98 and IS-2000 standards specify a transmitter dynamic range of nearly 80 dB. Co-owned co-pending U.S. patent application Ser. No. 10/382,297 entitled "RESONANT POWER CONVERTER FOR RADIO FREQUENCY TRANSMISSION AND METHOD" discloses methods of accomplishing that goal. At the high output power levels, corruption of channels (e.g. adjacent transmit channels or the receive channel) by quantization noise is highly undesirable.

If AGC is performed in the analog domain, the signal and quantization noise levels may scale together. For example, if the analog output signal level is reduced by 10 dB through AGC, the quantization noise may also be reduced by 10 dB as both signal and noise are scaled together by the same degree. Therefore, for each 1 dB of power level reduction, a corresponding 1 dB reduction in the out-of-band quantization noise may be achieved. If the power level is reduced substantially, the noise-shaping coder characteristics may be relaxed while still meeting the overall system noise requirements.

Consider the case of CDMA, where it is desirable for the basestation to receive roughly the same power level from each handset user, regardless of the distance between the handset user and the basestation. To accomplish this, the base basestation receiver may monitor each handset transmitter's power level. For example, once every 1.25 ms, the basestation may send a command to each handset, telling it to adjust the handset transmitter power level up or down.

Generally, higher power levels correspond to larger leakages from the handset's transmitter to the handset's receiver band, and therefore greater quantization noise. As the distance between the handset and the basestation increases, the handset must generally transmit at progressively higher power levels. However, as the distance between the handset and the basestation increases, the handset receiver must also be more sensitive. Furthermore, in implementations such as that described in U.S. patent application Ser. No. 10/382,297 previously referenced, a noise-shaping coder is employed just prior to the output transmitter. Therefore, the coder produces quantization noise that must be filtered by the resonator/duplexer. So when the power level is the highest, the quantization noise may also be the highest, and the corruption from the transmitter to the receiver may be the greatest.

Therefore, aggressive noise-shaping coder characteristics are highly desirable for the case of high transmitter power level. As the handset receives power level control commands from the basestation to decrease from higher to lower power levels, the noise-shaping characteristics may be relaxed as desired. This allows the noise-shaping coder characteristics to be directly or indirectly a function of the AGC level. The ability to relax the noise-shaping characteristics at lower power levels also advantageously allows reduction in power consumption.

Figure 6A:
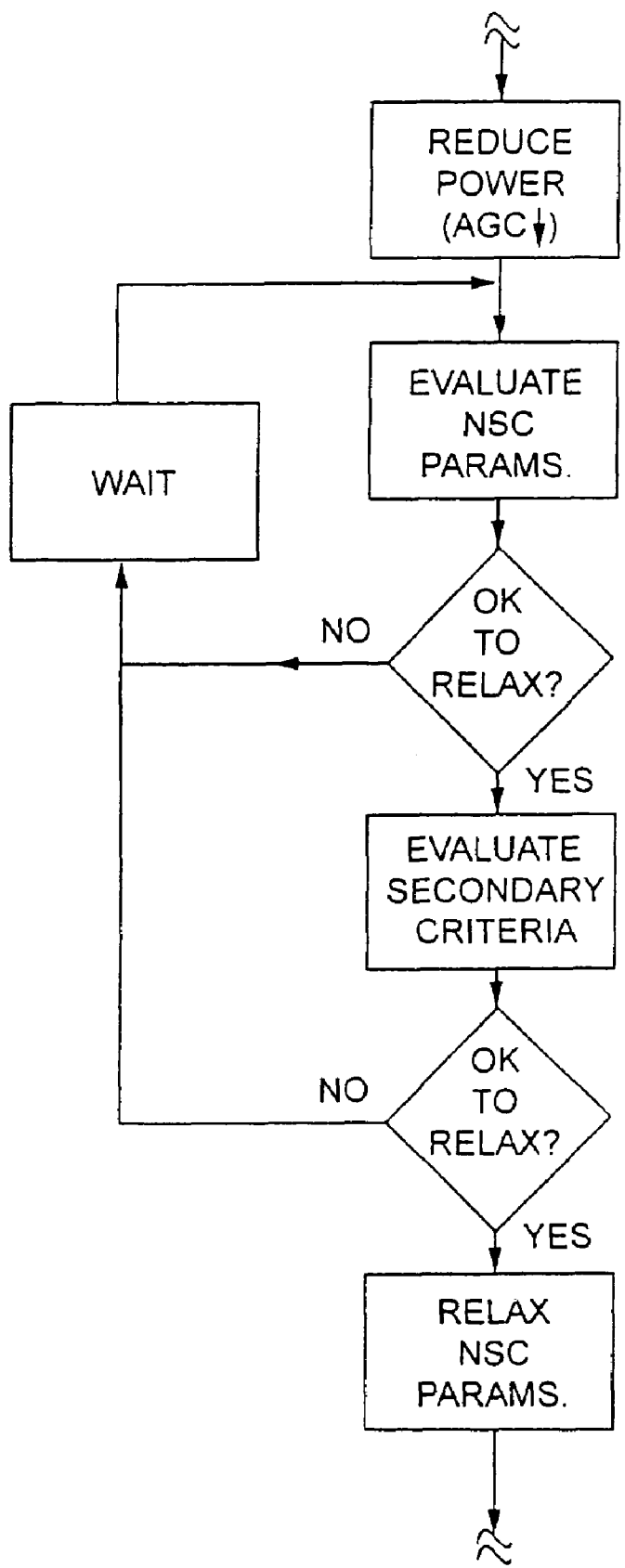
FIG. 6a is a logical flow diagram of a first exemplary method for noise-shaping coder relaxation as a function of AGC and/or other variables according to the invention.
Figure 6B:
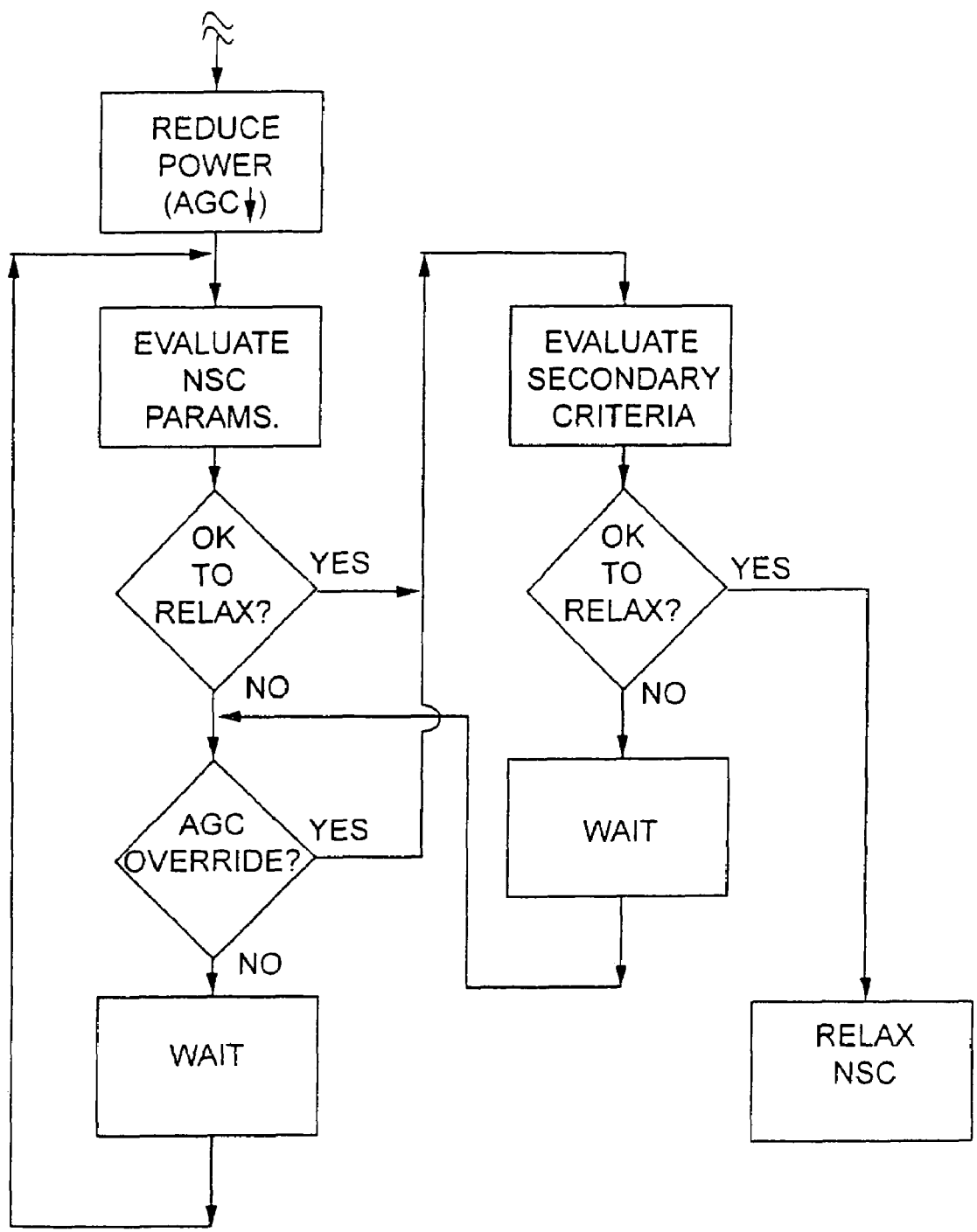
FIG. 6b is a logical flow diagram of a second exemplary method for noise-shaping coder relaxation as a function of AGC and/or other variables according to the invention.

It will be appreciated, however, that the noise shaping characteristics may alternatively or additionally be varied as a function of other parameters, such as a channel quality or an error rate-related metric. For example, as AGC level is reduced, the channel quality/error metric can be used in a confirmatory or permissive fashion to allow relaxation of the noise-shaping characteristics (see exemplary method of FIG. 6a). Alternatively, in limited circumstances, the channel quality or error metric(s) can be used to override the AGC profile, such as where (for whatever reason) the quality of the link is sufficient to sustain noise-shaping relaxation even at the higher power levels, and hence ostensibly lower power consumption, even when the AGC profile might call for the more stringent noise-shaping characteristics (see exemplary method of FIG. 6b). External metrics and the AGC level can also be used in a coincidence logic fashion if desired.

In one exemplary embodiment, the noise-shaping coder comprises a digital signal processing algorithm embedded in logic hardware. It has a high-speed clock and a high-speed data path, wherein arithmetic computations are being computed when the transmitter is on. For example, at the highest transmitter power level (e.g., +25 dBm), if a fifth-order noise-shaping coder is used to provide adequate quantization noise suppression out of band, then it is conceivable that only a third-order coder is needed when the transmitter power level is, say, +5 dBm. A reduction from a fifth- to third-order coder is a significant reduction in logic power consumption, so the handset consumes less overhead power at the lower transmit power level. Power efficiency is therefore improved at lower power levels.

Alternatively, the sampling rate of the coder could be reduced from $F_c$ (the carrier frequency) to $F_c/2$, effectively cutting the oversampling ratio by two to relax the noise shaping, which would cut the power consumption of the coder nearly in half. In the most extreme case at the lowest transmit power levels (e.g. near −50 dBm), it may be possible to reduce the coder complexity down to first-order, or alternatively, keep a third-order coder intact but cut the oversampling ratio by another factor (e.g., factor of two), depending on how much analog AGC dynamic range is available, and how much resonator rejection is also available.

Figure 7:
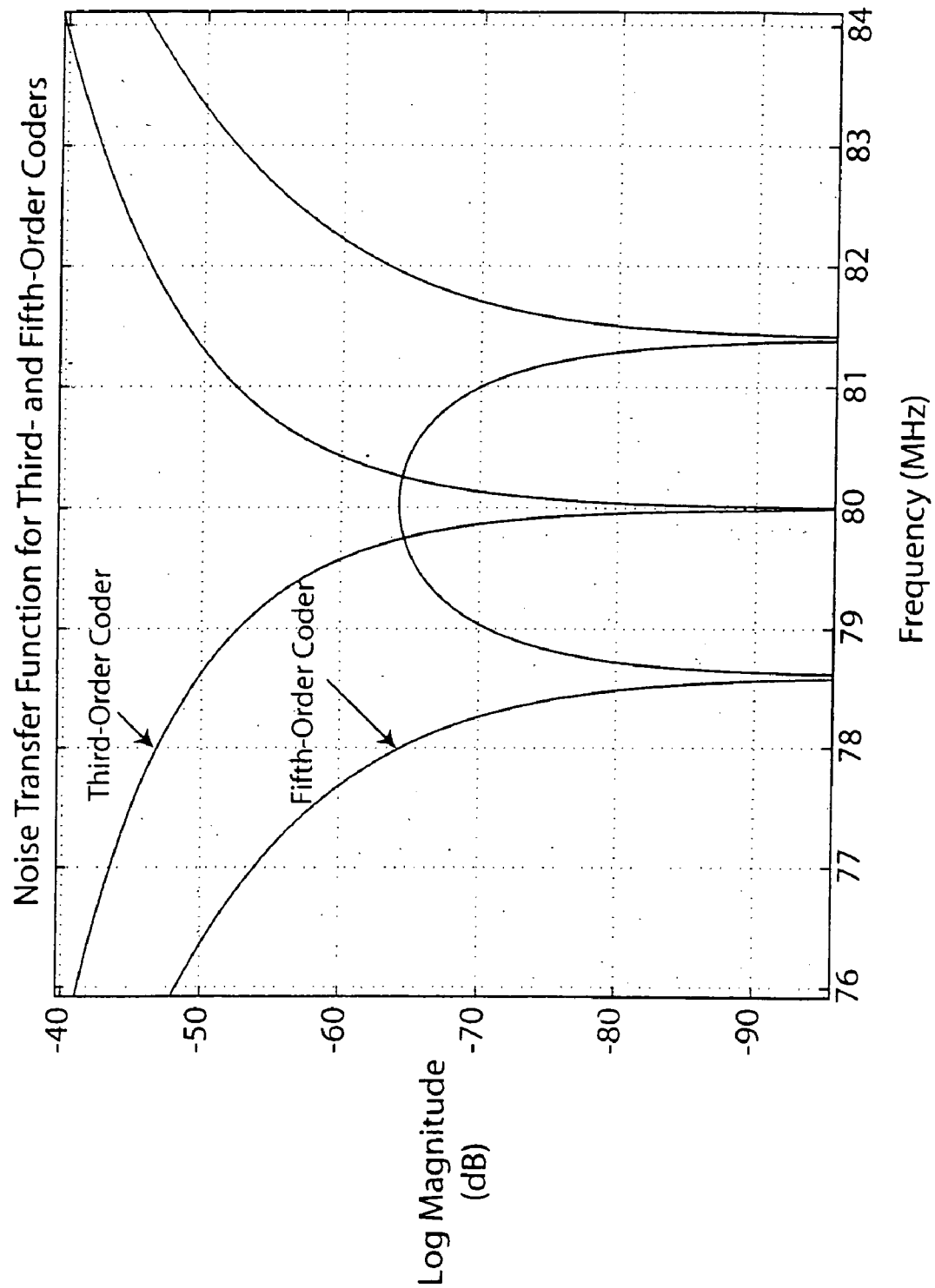
FIG. 7 is a graph illustrating the noise transfer function of the exemplary fifth-order noise shaping coder overlaid with that of a third-order coder.

As an example of the foregoing, FIG. 7 shows an overlay of the noise transfer functions of fifth-order noise-shaping coder of FIG. 3, along with that of a third-order coder, disclosed in U.S. patent application Ser. No. 10/382,297 previously incorporated herein. Over the same 3.84 MHz bandwidth centered at 80 MHz, the quantization noise rejection of the third-order coder is about 20 dB worse than that of the fifth-order coder. When the analog AGC is reduced by 20 dB, power consumption may be reduced by, inter alia, turning off the fifth-order coder and turning on the third-order coder, cutting the oversampling rate, and/or employing a combination of techniques.

By way of design example from U.S. application Ser. No. 10/382,297, filed Mar. 4, 2003 and incorporated herein by reference in its entirety, a third-order noise shaping encoder transfer function was given by $$H(z) = \frac{(1 - 1.928938\, z^{-1} + z^{-2})(1 - z^{-1})}{(1 - 1.427625\, z^{-1} + z^{-2})(1 - 0.625422\, z^{-1})}$$

or in general, for a third-order encoder, $$H(z) = \frac{(1 - c_1 z^{-1} + z^{-2})(1 - z^{-1})}{(1 - d_1 z^{-1} + z^{-2})(1 - d_2 z^{-1})}$$

Relating this to the variables shown in FIGS. 1 and 2, one may use basic signal flow graph analysis techniques to derive an exemplary set of design equations resulting in:

$g_1 = 2 - c_1$ $a_3 = 1 - d_2$ $a_2 = d_1 + d_2 - g_1 - a_3$ $a_1 = 1 + d_1 d_2 + a_2 + g_1 + 2a_3 - 3$

From these exemplary design equations, the previous example can be used to produce the desired coefficients for the third-order configuration of the structures of FIGS. 1 and 2:

$g_1 = 0.071062$ $a_3 = 0.374578$ $a_2 = 4.607407$ $a_1 = 4.320493$

Similarly, it will be appreciated that the same type of procedure can be readily used to design the fifth-order noise shaping encoder coefficients for the relevant portions of the configurations of FIGS. 1 and 2. The resulting coefficients from such a design procedure may be stored, for example, in a memory register file, such as a ROM or RAM or other storage device, for later loading into the encoder, as the desired encoder characteristics may change, for example, as a function of transmit power level or any other parameter of interest used for selecting the encoder characteristics and order.

RF Apparatus with Noise-Shaped Coder—

Figure 8:
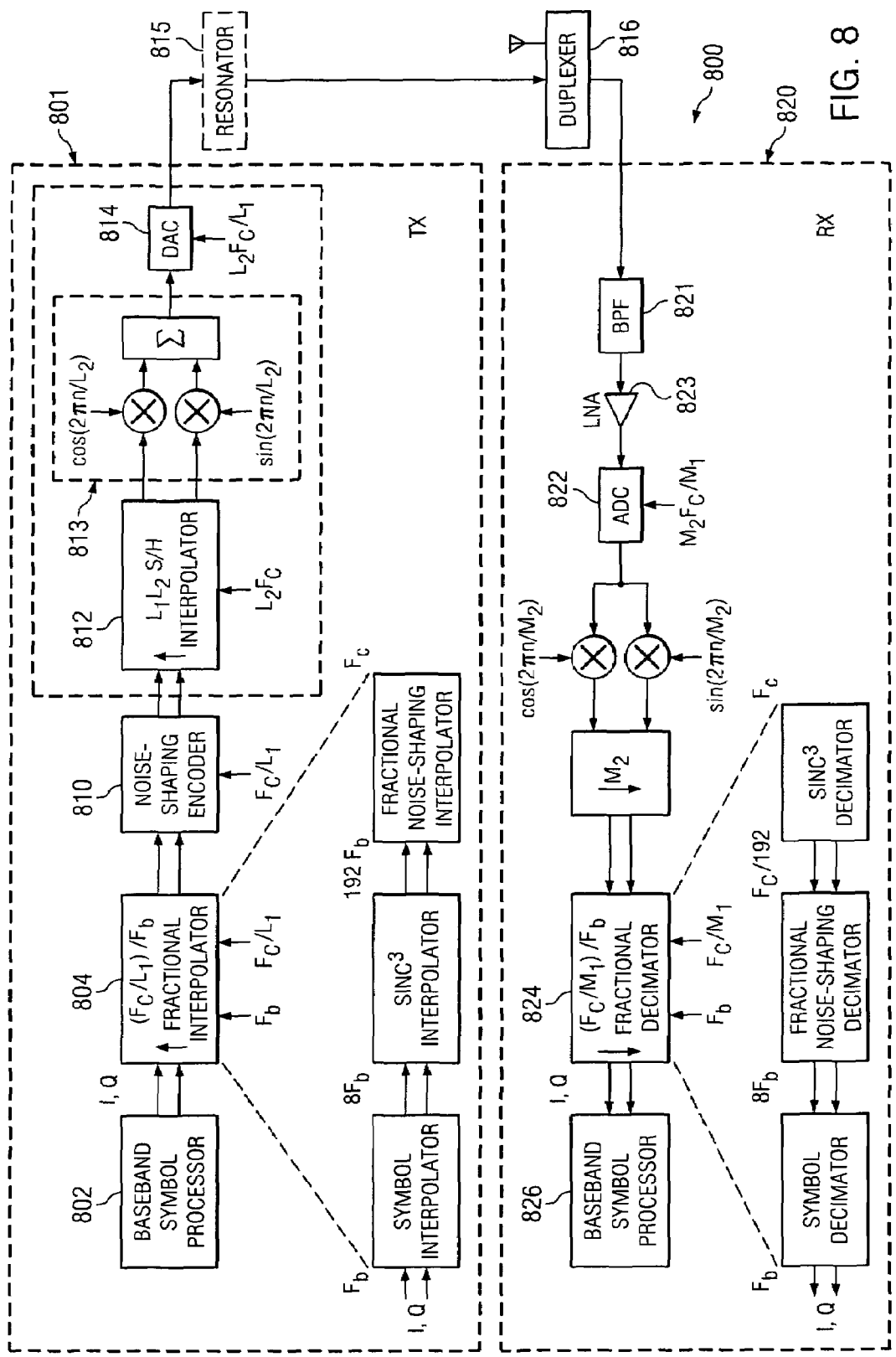
FIG. 8 is a functional block diagram of one exemplary embodiment of an RF transceiver apparatus incorporating the noise-shaping coder apparatus of the present invention.

Referring now to FIG. 8, an exemplary radio frequency transceiver system utilizing the improved converter of the present invention is described In one embodiment, the transceiver 800 comprises a transmitter section 801 with baseband processor 802, a fractional interpolator 804 (such as that described co-pending and co-owned U.S. patent application Ser. No. 10/910,910 entitled "NOISE SHAPED INTERPOLATOR AND DECIMATOR APPARATUS AND METHOD" previously incorporated herein), noise shaping coder (NSC) 810 such as the "programmable" variants described herein, sample and hold interpolator 812, a digital I/Q quadrature mixer and combiner 813, and a high-efficiency DAC 814 (such as that described in co-pending and co-owned U.S. patent application Ser. No. 10/910,917 entitled "RADIO FREQUENCY DIGITAL-TO-ANALOG CONVERTER" previously incorporated herein). A resonator 815 is also utilized in conjunction with the duplexer 816 to generate the analog output of the transmitter. As described in detail in co-owned and co-pending U.S.

patent application Ser. No. 10/382,297 filed Mar. 4, 2003 previously incorporated herein, the interpolator, NSC, DAC and resonator cooperate to convert the digital in-phase (I) and quadrature (Q) signals obtained from the baseband processor directly to an analog representation at carrier frequency for transmission over an antenna in a highly power-efficient manner.

The illustrated transmitter is further adapted to dislocate quantization noise generated by the transmitter outside of one or more receive bands associated with the receiver section of the transceiver. Specifically, as described in the Ser. No. 10/382,297 application referenced above, the baseband symbols are digitally interpolated up to a sample rate at or substantially near the desired frequency, and then encoded. The encoding method may be performed by a delta-sigma modulator or noise-shaping coder (NSC) as described herein. The output of the coder is represented by a coarsely quantized signal of one or more bits by an RDAC. The output of the RDAC is coupled to a bandpass filter or resonator. Overall, when compared with a conventional architecture, the use of the RDAC in the aforementioned circuit provides a lower resolution but higher speed, as opposed to higher resolution but lower speed of the prior art. When used in conjunction with the noise-shaping digital coder, the desired resolution is achieved in one or more bands of interest through the principle of noise shaping, as described in the foregoing incorporated U.S. patent applications.

The transceiver circuit 800 of FIG. 8 also includes a receiver section 820 including the duplexer 816, bandpass filter 821, amplifier 823, analog-to-digital converter (ADC) 822, fractional decimator 824 (which includes the fractional noise-shaping decimator described herein), and baseband processor 826 (which may or may not be the same baseband processor 802 as described above). The received signals are duplexed and sent to the ADC, wherein they are converted to the digital domain. Here the fractional noise-shaping decimator decimates the signal and ultimately (with the aid of other decimation) produces the digital in-phase (I) and quadrature (O) signals which may then be processed by the baseband processor.

The various circuits of the present invention may be rendered as stand-alone or discrete electronic circuits, as well as integrated circuit (IC) devices. Such integrated circuit devices may include, for example, system-on-chip (SoC) devices which integrate multiple functions or modules onto a single semiconductive die rendered in a sub-micron SiGe process. For example, in one embodiment of the present invention, the noise-shaping coder (NSC) circuits are included with the digitally switched resonator, RDAC, etc. of the direct-conversion architecture referenced above. Baseband processing may also optionally be included within this device. This highly integrated approach provides significant benefits in terms of size and compactness, power consumption, and ease of design and implementation. It also leverages one of the primary benefits of the exemplary direct-conversion architecture described above; i.e., simplification and obviation of many prior art RF amplifier and up-conversion/down-conversion components that would otherwise be provided as discrete devices.

It will also be recognized that while certain aspects of the invention are described in terms of a specific sequence of steps of a method or ordering of components in an apparatus adapted to implement the methodology of the broader invention, these descriptions are only illustrative of the broader invention, and may be modified as required by the particular application. Certain steps/components may be rendered unnecessary or optional under certain circumstances. Additionally, certain steps/components or functionality may be added to the disclosed embodiments, or the order of performance of two or more steps or components permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A dynamically adjustable noise shaping coder apparatus for use in a radio frequency (RF) transmitter, comprising:
   a first delta-sigma modulator having at least one programmable coefficient and at least one dither apparatus associated therewith, said first modulator being adapted to operate according to a first order;
   a second delta-sigma modulator having at least one programmable coefficient and at least one dither apparatus associated therewith, said second modulator being adapted to operate according to a second order;
   a third delta-sigma modulator having at least one programmable coefficient and at least one dither apparatus associated therewith, said third modulator being adapted to operate according to a third order; and
   a multiplexer coupled to an output of each of said first, second and third modulators;
   where said coder apparatus selectively varies, during operation, at least one of:
   (i) which of said first, second and third modulators is used;
   (ii) a value of said at least one programmable coefficient associated with at least one of said first, second and third modulators; and
   (iii) a dither level applied by said dither apparatus associated with at least one of said first, second and third modulators.

2. The coder apparatus of claim 1, wherein the coder apparatus selectively varies, during operation, each of:
   (i) which of said first, second and third modulators is used;
   (ii) the value of the at least one programmable coefficient associated with at least one of the first, second and third modulators; and
   (iii) the dither level applied by the dither apparatus associated with at least one of the first, second and third modulators.

3. A dynamically adjustable noise shaping coder apparatus for use in a radio frequency (RF) transmitter, comprising:
   a variable order delta-sigma modulator having at least one programmable coefficient and at least one dither apparatus associated therewith, said modulator being adapted to operate according to a first, second, or third order; and
   a multiplexer coupled to an output of said modulator, said multiplexer cooperating with said modulator to select said operation according to said first, second or third order;
   wherein said coder apparatus selectively varies, during operation, at least one of:
   (i) which of said first, second and third orders is selected;
   (ii) a value of said at least one programmable coefficient; and (iii) a dither level applied by said at least one dither apparatus.

4. The coder apparatus of claim 3, wherein the coder apparatus selectively varies, during operation, each of:
(i) which of the first, second and third orders is selected;
(ii) the value of the at least one programmable coefficient; and
(iii) the dither level applied by the at least one dither apparatus.

5. A dynamically adjustable coding apparatus for use in a radio frequency (RF) communications or data system, wherein said apparatus comprises:
a delta-sigma modulator, wherein the coding apparatus is operable to selectively adjust, during operation, one or more coefficients of said modulator and a dither level associated with at least a portion of said modulator, wherein said apparatus comprises a variable-order coder including the modulator, the coder variable during operation between at least two coder orders, said at least two coder orders selected from the group consisting of first-order, third-order, and fifth-order.

6. The apparatus of claim 5, wherein said RF system comprises a system utilizing a code-division multiple access (CDMA) air interface.

7. The apparatus of claim 5, wherein said selective adjustment of said dither level comprises adjusting said dither level based at least in part on a selected coder-order.

8. The apparatus of claim 7, wherein said adjustment of said dither level based at least in part on the selected coder-order further comprises adjusting the dither level based on both said selected coder-order and an input signal level.

9. The apparatus of claim 5 wherein said apparatus comprises three substantially discrete coder apparatus.

10. The apparatus of claim 9, wherein said three coder apparatus comprise first-order, third-order, and fifth-order coders, respectively, and outputs from each of said first-order, third-order, and fifth-order coders are switched onto a common output.

11. The apparatus of claim 5, wherein said apparatus comprises substantially integrated tri-order coder apparatus having a switched feedback loop.

12. The apparatus of claim 5, wherein the coding apparatus is operable to selectively adjust a clocking applied to one or more components of said modulator.

13. The apparatus of claim 12, wherein said selective adjustment of the clocking applied to one or more components of said modulator comprises selectively changing a clocking frequency thereof.

14. A power-efficient radio frequency (RF) transmitter apparatus, comprising:
a baseband processor;
an antenna; and
a noise-shaping coder apparatus operatively disposed in a signal path between said processor and said antenna;
wherein said coder apparatus is adapted to selectively alter its configuration during operation in order to reduce power consumption by said transmitter apparatus, and wherein said coder apparatus comprises a delta-sigma modulator, and said alteration of configuration comprises selectively varying at least one of (i) coder order, (ii) clock generation, and (iii) dither level for said modulator.

15. The transmitter apparatus of claim 14 wherein said alteration of configuration comprises varying at least the coder order based at least in part on a transmission parameter.

16. The transmitter apparatus of claim 15, wherein said transmission parameter is related to a suggested or required value received from another entity with which said transmitter apparatus is in communication.

17. The transmitter apparatus of claim 16, wherein said another entity comprises a cellular base station, and said value comprises an automatic gain control (AGC) value.

18. The transmitter apparatus or claim 14, further comprising a resonator disposed within said signal path between said antenna and said coder apparatus.

19. A method of operating a modulator in a radio frequency (RF) system, comprising:
providing a delta-sigma modulator having a plurality of orders associated therewith;
selectively operating said delta-sigma modulator at different ones of said plurality of orders based on at least one parameter; and
selectively adjusting a dither level associated with at least a portion of said modulator.

20. The method of claim 19, wherein said plurality of orders comprise at least third- and fifth-orders.

21. The method of claim 20, wherein said at least one parameter comprises a parameter related to transmission power, and said act of selectively operating comprises increasing the order of said modulator as the required transmission power for said RF system increases.

22. The method of claim 20, wherein said at least one parameter comprises an operating mode of said RF system, and said act of selectively operating comprises varying at least one of (i) coder order, (ii) modulator coefficients, and (iii) modulator dither level.

23. A method of operating a modulator in a radio frequency (RF) system, comprising:
providing a delta-sigma modulator having a plurality of orders associated therewith; and
selectively operating said delta-sigma modulator at different ones of said plurality of orders based on at least one parameter, wherein the parameter comprises at least one of modulator pole and zero locations;
wherein said plurality of orders comprise at least third- and fifth-orders, and
wherein said operating mode comprises a reduced power mode.

24. A method of operating a modulator in a radio frequency (RF) system, comprising:
providing a delta-sigma modulator having a plurality of orders associated therewith;
selectively operating said delta-sigma modulator at different ones of said plurality of orders based on at least one parameter; and
selectively adjusting a dither level associated with at least a portion of said modulator;
wherein said plurality of orders comprise at least third- and fifth-orders, and
wherein said at least one parameter comprises a parameter related to transmission power, and said act of selectively operating comprises reducing a sampling rate of said modulator while operating in at least one of said plurality of orders.

25. A noise-shaping coder apparatus adapted for use in a radio frequency (RF) system, comprising:
a delta-sigma modulator adapted to dispose at least one noise shaping artifact substantially at one or more frequency bands of interest, wherein said modulator is configured to operate as a fifth-order coder, and said at least one artifact comprises a double-pair of complex zeros; wherein said modulator is further configured to operate as a third-order coder, said modulator switching between operation as the fifth-order coder and the third-order coder.

26. The apparatus of claim 25, wherein one of said frequency bands of interest comprises a receive band for said RF system.

27. The apparatus of claim 26 wherein said double-pair substantially suppresses quantization noise associated with said modulator with a band at least 3 MHz wide.

28. The apparatus of claim 25 wherein said modulator switches between operation as the fifth-order coder and the third-order coder based at least in part on a transmit power of said system.

* * * * *

UNITED STATES PATENT AND TRADEMARK OFFICE
CERTIFICATE OF CORRECTION

PATENT NO. : 7,561,635 B2 Page 1 of 1
APPLICATION NO. : 10/910941
DATED : July 14, 2009
INVENTOR(S) : Steven R. Norsworthy and Jason Rupert Redgrave It is certified that error appears in the above-identified patent and that said Letters Patent is hereby corrected as shown below:

Claim 23, Column 14, Line 44, prior to "wherein said operating mode comprises" please insert -- wherein said at least one parameter comprises an operating mode, --.

Signed and Sealed this

Eighth Day of September, 2009

David J. Kappos
*Director of the United States Patent and Trademark Office*

UNITED STATES PATENT AND TRADEMARK OFFICE
CERTIFICATE OF CORRECTION

PATENT NO.         : 7,561,635 B2                                                                Page 1 of 1
APPLICATION NO. : 10/910941
DATED              : July 14, 2009
INVENTOR(S)        : Steven R. Norsworthy and Jason Rupert Redgrave It is certified that error appears in the above-identified patent and that said Letters Patent is hereby corrected as shown below:

Column 14, Claim 18, line 8, delete "or" and replace with -- of --.

Signed and Sealed this

Sixteenth Day of November, 2010

David J. Kappos
*Director of the United States Patent and Trademark Office*